(12) United States Patent
Fujii

(10) Patent No.: US 10,074,470 B2
(45) Date of Patent: Sep. 11, 2018

(54) PASSIVE DEVICE SUBSTRATE

(71) Applicant: SHINKO ELECTRIC INDUSTRIES CO., LTD., Nagano (JP)

(72) Inventor: Tomoharu Fujii, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 258 days.

(21) Appl. No.: 14/673,938

(22) Filed: Mar. 31, 2015

(65) Prior Publication Data

US 2015/0302973 A1 Oct. 22, 2015

(30) Foreign Application Priority Data

Apr. 22, 2014 (JP) ................. 2014-088290

(51) Int. Cl.
*H01F 5/00* (2006.01)
*H01F 27/28* (2006.01)
*H01F 17/00* (2006.01)

(52) U.S. Cl.
CPC . *H01F 17/0006* (2013.01); *H01F 2017/0066* (2013.01); *H01L 2224/16227* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2924/181* (2013.01); *H01L 2924/19103* (2013.01); *H01L 2924/19105* (2013.01); *H01L 2924/19107* (2013.01)

(58) Field of Classification Search
CPC .................................. H01F 5/00; H01F 27/28
USPC .................. 336/200, 232; 257/531
See application file for complete search history.

(56) References Cited

U.S. PATENT DOCUMENTS

| 5,583,474 A * | 12/1996 | Mizoguchi .......... H01F 17/0006 336/200 |
| 5,852,866 A * | 12/1998 | Kuettner ............. H01F 17/0006 29/602.1 |
| 6,191,468 B1 * | 2/2001 | Forbes ................ H01F 17/0013 257/528 |
| 6,441,715 B1 * | 8/2002 | Johnson .............. H01F 17/0006 257/E21.022 |
| 6,714,113 B1 * | 3/2004 | Abadeer ............. H01L 23/5227 257/531 |

(Continued)

FOREIGN PATENT DOCUMENTS

| JP | H5-43567 U | 6/1993 |
| JP | 2008-103603 | 5/2008 |

(Continued)

OTHER PUBLICATIONS

Office Action dated Oct. 31, 2017 issued with respect to the basic Japanese Patent Application No. 2014-088290.

*Primary Examiner* — Tsz Chan
(74) *Attorney, Agent, or Firm* — IPUSA, PLLC

(57) ABSTRACT

A passive device substrate includes a substrate, a passive device disposed at a first surface of the substrate, an insulating layer disposed on the first surface of the substrate to cover the passive device, a magnetic layer disposed on an opposite side of the insulating layer from the substrate to overlap the passive device in a plan view taken in a thickness direction of the substrate, and a metal layer disposed on a second surface of the substrate to overlap the passive device in the plan view.

8 Claims, 4 Drawing Sheets

(56) References Cited

U.S. PATENT DOCUMENTS

| | | | | |
|---|---|---|---|---|
| 7,518,480 B1* | 4/2009 | Dening | ............... | H01F 17/0006 336/200 |
| 8,331,103 B2* | 12/2012 | Oka | .................... | H01F 17/0013 336/200 |
| 8,552,829 B2* | 10/2013 | Kroener | .............. | H01F 27/2804 336/199 |
| 2003/0076210 A1* | 4/2003 | Gomez | ............... | H01F 17/0013 336/200 |
| 2003/0184426 A1* | 10/2003 | Song | .................. | H01F 17/0006 336/200 |
| 2008/0197963 A1* | 8/2008 | Muto | ................. | H01F 17/0013 336/200 |
| 2010/0078787 A1 | 4/2010 | Yakubo | | |
| 2013/0032923 A1* | 2/2013 | Lin | ......................... | H01L 28/10 257/531 |

FOREIGN PATENT DOCUMENTS

| | | |
|---|---|---|
| JP | 2009-88099 | 4/2009 |
| JP | 2010-109351 | 5/2010 |

* cited by examiner

PASSIVE DEVICE SUBSTRATE

CROSS-REFERENCE TO RELATED APPLICATIONS

The present application is based upon and claims the benefit of priority from the prior Japanese Patent Application No. 2014-088290 filed on Apr. 22, 2014, with the Japanese Patent Office, the entire contents of which are incorporated herein by reference.

FIELD

The disclosures herein relate to a passive device substrate.

BACKGROUND

Passive devices such as an inductor, a capacitor, and a resistor are integrated on a silicon substrate, a glass substrate, or a ceramic substrate to form a passive device substrate that is known in the art as an integrated passive device. An integrated passive device typically has an inductor having an air core, and the passive devices such as an inductor, a capacitor, and a resistor fabricated in an integrated passive device tend to have small impedance values. These devices are used in a circuit that passes high-frequency signals (i.e., high-speed signals).

An integrated passive device may be formed as a laminated structure with other devices such as another integrated circuit, or may be flip-chip mounted on a wiring substrate. In such a case, an inductor of the integrated passive device that has an air core structure may be affected by the other devices and the interconnection patterns of the wiring substrate. Because of this, the inductance value and Q value of the inductor may deviate from designed values.

Further, a high-frequency signal (i.e., high-speed signal) flowing in an integrated passive device may function as a noise source that affects other devices and the interconnections of a wiring substrate. Implementation utilizing an integrated passive device structure thus requires placement and mounting that take into account the characteristics of an integrated passive device, and also requires restriction on the design of a wiring substrate.

As described above, the related-art integrated passive device structure gives rise to a difficulty in providing desired circuit characteristics for implemented passive devices, and also serves as a noise source.

Accordingly, it may be desirable to provide a passive device substrate that enables the provision of desired circuit characteristics for implemented passive devices and also enables the reduction of noise.

[Patent Document 1] Japanese Laid-open Patent Publication No. 2010-109351

SUMMARY

According to an aspect of the embodiment, a passive device substrate includes a substrate, a passive device disposed at a first surface of the substrate, an insulating layer disposed on the first surface of the substrate to cover the passive device, a magnetic layer disposed on an opposite side of the insulating layer from the substrate to overlap the passive device in a plan view taken in a thickness direction of the substrate, and a metal layer disposed on a second surface of the substrate to overlap the passive device in the plan view.

According to at least one embodiment, a passive device substrate is provided that enables the provision of desired circuit characteristics for implemented passive devices and also enables the reduction of noise.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Figure 1:
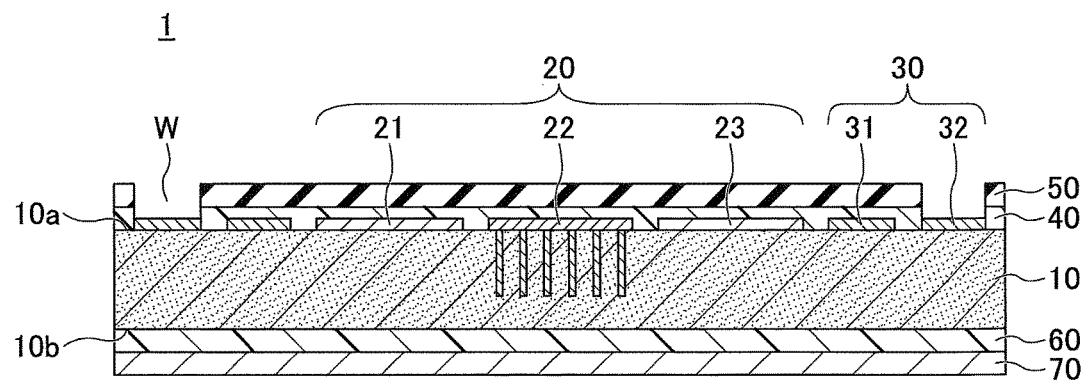
FIG. 1 is a cross-sectional view illustrating an example of a passive device substrate according to a first embodiment.

FIG. 1 is a cross-sectional view illustrating an example of a passive device substrate according to a first embodiment. In FIG. 1, a passive device substrate 1 includes a substrate 10, one or more passive devices 20, an interconnection layer 30, an insulating layer 40, a magnetic layer 50, an insulating layer 60, and a metal layer 70.

In the present embodiment, for the sake of convenience, the side toward which the magnetic layer 50 faces is referred to as an upper side or a first side, and the side toward which the metal layer 70 faces is referred to as a lower side or a second side. Further, the surface of a member situated toward the magnetic layer 50 is referred to as an upper surface or a first surface, and the other surface of the member situated toward the metal layer 70 is referred to as a lower surface or a second surface. It may be noted, however, that the passive device substrate 1 may be used in an upside-down position, or may be placed at any angle. In the present embodiment, a plan view refers to a view taken in the direction normal to a first surface 10a of the substrate 10, and a plan shape is a shape as viewed in the direction normal to the first surface 10a of the substrate 10.

The substrate 10 serves as a foundation base for the passive devices 20 and the like. The substrate 10 may be an inorganic substrate such as a silicon substrate, a glass substrate, a ceramic substrate, or the like. The thickness of the substrate 10 may approximately be 30 to 400 micrometers, for example.

The passive devices 20 are formed on or in the first surface 10a of the substrate 10. A portion of the passive devices 20 may be formed in the substrate 10. In the present embodiment, the passive devices 20 include an inductor 21 (e.g., a flat coil formed of a spiral wire), a capacitor 22, and a resistor 23. These are not limiting examples, and the passive devices 20 fabricated on the substrate 10 may be any type of passive element as selected according to need. The number of fabricated passive elements may also be determined as appropriate.

The interconnection layer 30 is formed on the first surface 10a of the substrate 10. The interconnection layer 30 includes at least one interconnection pattern 31 and at least one pad 32. The interconnection pattern 31 may provide connections between the passive devices 20 and/or between the passive devices 20 and the pad 32. The pad 32 is exposed from an opening W that is formed through the insulating layer 40 and the magnetic layer 50, and serves as a connection terminal to be coupled to another device, a wiring substrate, or the like. The interconnection layer 30 may be made of copper or the like. The passive devices 20 and the interconnection layer 30 are insulated from the substrate 10 by an insulating film (e.g., silicon-oxide film) that is formed (not shown) on the surface of the substrate 10.

The insulating layer 40 is formed on the first surface 10a of the substrate 10 so as to cover the passive devices 20 and the interconnection layer 30. Epoxy-type resin or polyimide-type resin, for example, may be used as the material of the insulating layer 40. The thickness of the insulating layer 40 may approximately be several micrometers to several dozen micrometers. The insulating film 40 may be formed by use of a spin-coating process or the like.

The magnetic layer 50 is formed on the upper surface of the insulating layer 40 (i.e., the surface opposite from the substrate 10) in such a manner as to overlap the passive devices 20 in the plan view. The magnetic layer 50 may be formed on the entire upper surface of the insulating layer 40. The material of the magnetic layer 50 may be magnetic substance such as ferrite, nickel, cobalt, or the like. The thickness of the magnetic layer 50 may approximately be 0.5 to 10 micrometers, for example. The magnetic layer 50 may be formed by use of a spin spray plating process, a spattering process, or the like. The use of ferrite for the magnetic layer 50 makes the magnetic layer 50 nonconductive. In such a case, placing the magnetic layer 50 in the proximity of the passive devices 20 of the passive device substrate 1 does not affect the circuit characteristics of the passive devices 20.

The insulating layer 60 is formed on a second surface 10b of the substrate 10. The material and thickness of the insulating layer 60 and a method of making the insulating layer 60 may be the same as or similar to those of the insulating layer 40. The insulating layer 60 is provided in order to improve insulation between the substrate 10 and the metal layer 70. Namely, the provision of the insulating layer 60 between the substrate 10 and the metal layer 70 serves to improve insulation between the substrate 10 and the metal layer 70, compared with the case in which only an insulating film (e.g., silicon-oxide film) is formed (not shown) on the surface of the substrate 10.

The metal layer 70 is formed on the lower surface of the insulating layer 60 in such a manner as to overlap the passive devices 20 in the plan view. The metal layer 70 may be formed on the entire lower surface of the insulating layer 60. The material of the metal layer 70 may be copper, aluminum, silver, or the like. The thickness of the metal layer 70 may approximately be 100 nanometers to 20 micrometers, for example. The metal layer 70 may be formed by use of a sputtering process, a plating process, a printing process, or the like. The metal layer 70 may have openings formed therethrough having a dot shape or the like. Alternatively, the metal layer 70 may have a mesh shape. With such an arrangement, the adhesion between the metal layer 70 and the insulating layer 60 is improved, and the warping of the passive device substrate 1 may be reduced.

As described above, the passive device substrate 1 has the magnetic layer 50 formed over the passive devices 20 with the insulating layer 40 placed therebetween. The magnetic layer 50 serves to absorb noise generated by the passive devices 20 during their operations to convert the noise into heat. Consequently, noise released to outside the passive device substrate 1 is more reduced than in the conventional art.

It may be noted that the first surface 10a of the substrate 10 has the passive devices 20 and the interconnection layer 30 formed thereon, thereby creating unevenness (i.e., with raised portions and recessed portions). Disposing the magnetic layer 50 directly on the first surface 10a of the substrate 10 without having the insulating layer 40 placed therebetween may cause the lack of stable crystal orientations due to the effect of the unevenness on the first surface 10a of the substrate 10. The provision of the insulating layer 40 causes the insulating layer 40 to absorb the unevenness created by the passive devices 20, thereby providing a flat surface (i.e., the upper surface of the insulating layer 40) on which the magnetic layer 50 is formed. With this arrangement, the magnetic layer 50 is formed with even thickness without being affected by the unevenness on the first surface 10a of the substrate 10. It follows that the magnetic layer 50 has stable crystal orientations, and provides desired characteristics.

Further, the passive device substrate 1 has the metal layer 70 formed under the second surface 10b of the substrate 10 with the insulating layer 60 placed therebetween. The metal layer 70 serves to reflect noise generated by the passive devices 20 during their operations. Consequently, noise released to outside the passive device substrate 1 is more reduced than in the conventional art. The metal layer 70 also serves to reflect noise coming from an external source. Namely, the effect on the passive device substrate 1 of noise coming from an external source is reduced. It may be noted that the insulating layer 60 and the metal layer 70 may not be provided when the effect of noise originating from an external source does not cause a problem.

It may be noted that, with respect to a passive device of interest among the passive devices 20, at least a portion of the magnetic layer 50 is situated directly above the passive device of interest, and preferably covers (i.e., encompasses) the entirety of the passive device of interest in the plan view. Further, at least a portion of the metal layer 70 is situated directly below the passive device of interest, and preferably covers (i.e., encompasses) the entirety of the passive device of interest in the plan view.

<First Variation of First Embodiment>

This first variation of the first embodiment is directed to a configuration in which a magnetic layer is additionally provided on the back surface (i.e., lower surface) of the passive device substrate. In connection with the first variation of the first embodiment, a description of the same or similar constituent elements as those of the previously provided descriptions may be omitted as appropriate.

Figure 2:
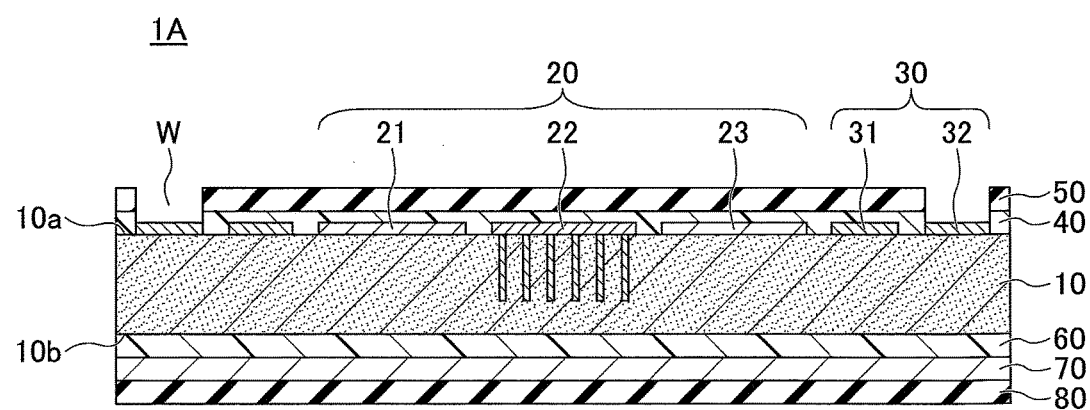
FIG. 2 is a cross-sectional view illustrating an example of a passive device substrate according to a first variation of the first embodiment.

FIG. 2 is a cross-sectional view illustrating an example of a passive device substrate according to the first variation of the first embodiment. In FIG. 2, a passive device substrate 1A differs from the passive device substrate 1 (see FIG. 1) in that a magnetic layer 80 (i.e., second magnetic layer) is additionally provided.

The magnetic layer 80 is formed on the lower surface of the metal layer 70 (i.e., the surface opposite from the substrate 10) in such a manner as to overlap the passive devices 20 in the plan view. The magnetic layer 80 may be formed on the entire lower surface of the metal layer 70. The material and thickness of the magnetic layer 80 and a method of making the magnetic layer 80 may be the same as or similar to those of the magnetic layer 50. Alternatively, the material and thickness of the magnetic layer 80 and the method of making the magnetic layer 80 may be different from those of the magnetic layer 50. Since the lower surface of the metal layer 70 is flat, the magnetic layer 80 will have even thickness when formed. It follows that the magnetic layer 80 has stable crystal orientations, and provides desired characteristics.

As described above, the passive device substrate 1A has the magnetic layer 80 additionally formed on the lower surface of the metal layer 70. The magnetic layer 80 serves to absorb noise coming from an external source by changing the noise into heat. This function of the metal layer 70, together with the function of the metal layer 70 to reflect noise coming from an external source, effectively reduces the effect on the passive device substrate 1A of the noise coming from an external source.

It may be noted that, with respect to a passive device of interest among the passive devices 20, at least a portion of the magnetic layer 80 is situated directly below the passive device of interest, and preferably covers (i.e., encompasses) the entirety of the passive device of interest in the plan view.

<Second Variation of First Embodiment>

The second variation of the first embodiment is directed to a configuration in which a metal layer is electrically coupled to the ground in the passive device substrate. In connection with the second variation of the first embodiment, a description of the same or similar constituent elements as those of the previously provided descriptions may be omitted as appropriate.

Figure 3:
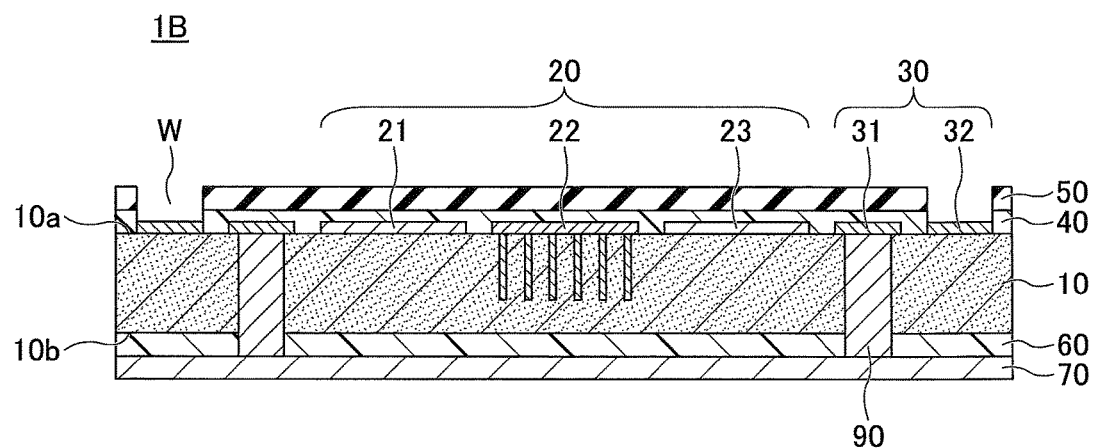
FIG. 3 is a cross-sectional view illustrating an example of a passive device substrate according to a second variation of the first embodiment.

FIG. 3 is a cross-sectional view illustrating an example of a passive device substrate according to the second variation of the first embodiment. In FIG. 3, a passive device substrate 1B differs from the passive device substrate 1 (see FIG. 1) in that at least one through-hole interconnection 90 is additionally provided. The through-hole interconnection 90 penetrates through the substrate 10 and the insulating layer 60 to provide an electrical coupling between the interconnection pattern 31 and the metal layer 70.

Copper or the like may be used as the material of the through-hole interconnection 90. In the passive device substrate 1B, the interconnection pattern 31 is a ground interconnection pattern. Namely, the metal layer 70 is electrically coupled to the ground in the passive device substrate 1B. It may be noted that the through-hole interconnection 90 is insulated from the substrate 10 by an insulating film (e.g., silicon-oxide film) that is formed (not shown) on the inner wall of the hole penetrating through the substrate 10.

With the arrangement described above, the metal layer 70 is electrically coupled to the ground in the passive device substrate 1B. In the passive device substrate 1 (see FIG. 1) and the passive device substrate 1A (see FIG. 2), the metal layer 70 is in a floating state, and is thus only capable of reflecting noise. In the passive device substrate 1B, on the other hand, the metal layer 70 is coupled to the ground, and thus serves to direct the noise arriving at the metal layer 70 to the ground. This arrangement reduces a risk of the metal layer 70 reflecting the noise arriving at the metal layer 70 to affect other devices or the like.

Similarly to the passive device substrate 1A, the magnetic layer 80 may additionally be formed on the lower surface of the metal layer 70. Such an arrangement provides the advantages as described in connection with the first variation of the first embodiment.

<Examples of Practical Application of First Embodiment>

This example of practical application of the first embodiment is directed to a module that utilizes the passive device substrate of the first embodiment. In connection with the example of practical application of the first embodiment, a description of the same or similar constituent elements as those of the previously provided descriptions may be omitted as appropriate. In FIG. 4 through FIG. 8, the reference numerals associated with the passive device substrate 1 (see FIG. 1) are omitted from illustration for the sake of improved visibility.

Figure 4:
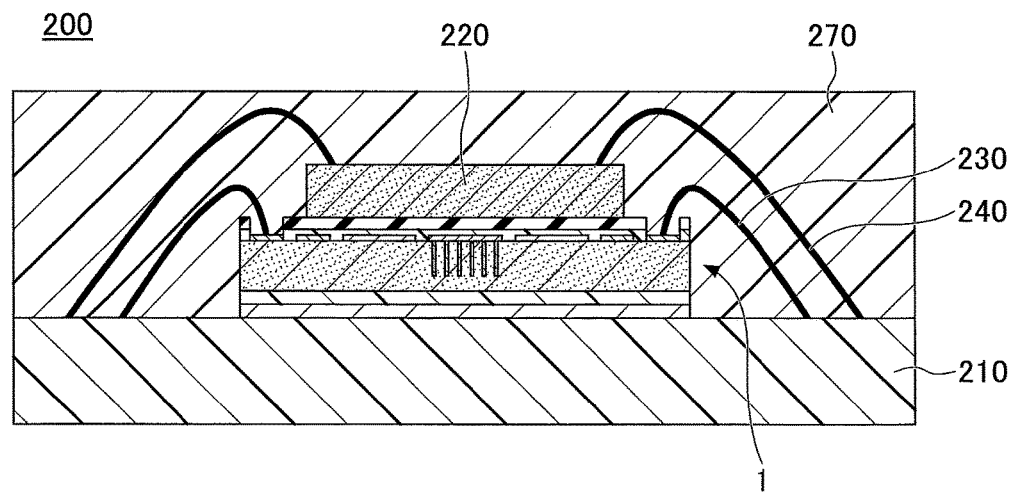
FIG. 4 is a cross-sectional view illustrating an example of a module according to an example of practical application of the first embodiment.

FIG. 4 is a cross-sectional view illustrating an example of a module according to the example of practical application of the first embodiment. As illustrated in FIG. 4, a module 200 includes a substrate 210 on which the passive device substrate 1 is mounted with the passive devices 20 facing upward, and includes a semiconductor chip 220 mounted on the passive device substrate 1 with its face up. Adhesive layers (not shown) or the like are used to fixedly attach the substrate 210 to the passive device substrate 1 and to fixedly attach the semiconductor chip 220 to the passive device substrate 1. The passive device substrate 1 and the semiconductor chip 220 may be encapsulated with a mold resin 270.

The pad 32 of the passive device substrate 1 is coupled to a pad (not shown) of the substrate 210 via a bonding wire 230. A pad (not shown) of the semiconductor chip 220 is coupled to a pad (not shown) of the substrate 210 via a bonding wire 240.

The module 200 has a configuration in which the passive devices 20 of the passive device substrate 1 are situated close to the semiconductor chip 220. In this configuration, however, the insulating layer 40 and the magnetic layer 50 are in existence between the passive devices 20 and the semiconductor chip 220. Because of this, the circuit characteristics of the passive devices 20 are not affected by the semiconductor chip 220. Namely, the mounting structure as used in the module 200 ensures that the inductance values and the like of the passive devices 20 stays the same as the intended design values.

Figure 5:
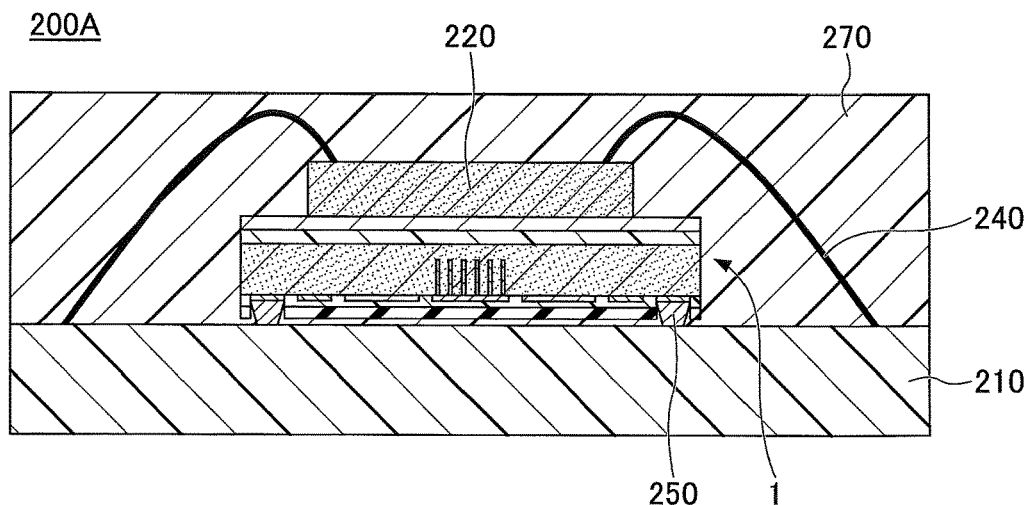
FIG. 5 is a cross-sectional view illustrating another example of the module according to the example of practical application of the first embodiment.

FIG. 5 is a cross-sectional view illustrating another example of a module according to the example of practical application of the first embodiment. As illustrated in FIG. 5, a module 200A includes a substrate 210 on which the passive device substrate 1 is flip-chip mounted with the passive devices 20 facing downward, and includes a semiconductor chip 220 mounted on the passive device substrate 1 with its face up. An adhesive layer (not shown) or the like is used to fixedly attach the passive device substrate 1 to the semiconductor chip 220. The passive device substrate 1 and the semiconductor chip 220 may be encapsulated with the mold resin 270.

The pad 32 of the passive device substrate 1 is coupled to a pad (not shown) of the substrate 210 via a bump 250 (e.g., solder bump or Au bump). A pad (not shown) of the semiconductor chip 220 is coupled to a pad (not shown) of the substrate 210 via the bonding wire 240.

The module 200 has a configuration in which the passive devices 20 of the passive device substrate 1 are situated close to interconnection patterns (not shown) formed on the substrate 210. In this configuration, however, the insulating layer 40 and the magnetic layer 50 are in existence between the passive devices 20 and the interconnection patterns. Because of this, the circuit characteristics of the passive devices 20 are not affected by the interconnection patterns formed on the substrate 210. Namely, the mounting structure as used in the module 200A ensures that the inductance values and the like of the passive devices 20 stay the same as the intended design values.

Figure 6:
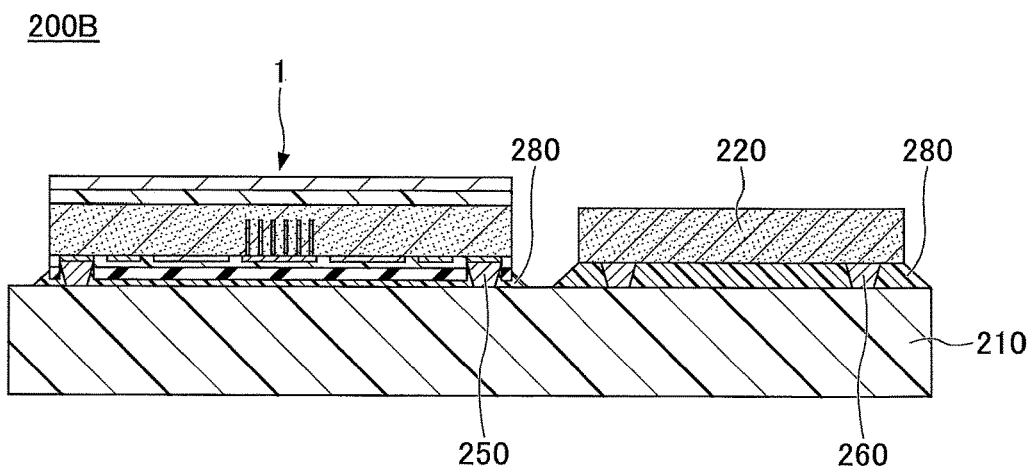
FIG. 6 is a cross-sectional view illustrating yet another example of the module according to the example of practical application of the first embodiment.

FIG. 6 is a cross-sectional view illustrating yet another example of a module according to the example of practical application of the first embodiment. A module 200B illustrated in FIG. 6 has a configuration in which the semiconductor chip 220 is flip-chip mounted on the substrate 210 with a bump 260 placed therebetween. Such a configuration also provides the same or similar advantages as those described in connection with FIG. 5. A gap between the substrate 210 and each of the passive device substrate 1 and the semiconductor chip 220 may be filled with underfill resin 280.

A structure having a conventional passive device substrate mounted as illustrated in FIG. 4 through FIG. 6 does not have the magnetic layer 50 and the like. In such a structure, the passive devices of the conventional passive device substrate are affected by the semiconductor chip 220 and the interconnection patterns formed on the substrate 210. As a result, the circuit characteristics of the passive devices implemented in the conventional passive device substrate are changed from the intended design values. Each time the mounting structure is changed, deviations from intended design values are measured to adjust the design for reconciliation, thereby giving rise to the problem of a prolonged design time.

The use of the passive device substrate 1 of the first embodiment avoids such a problem due to the effect of the magnetic layer 50 and the like. The same applies in the case of the mounting structures illustrated in FIG. 4 through FIG. 6 in which the passive device substrate 1A or the passive device substrate 1B is employed.

Figure 7:
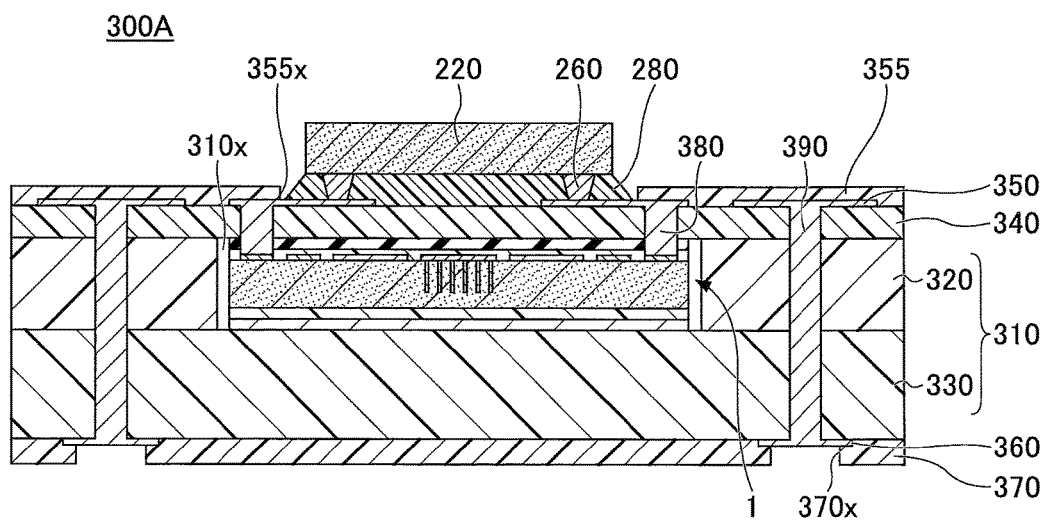
FIG. 7 is a cross-sectional view illustrating still another example of the module according to the example of practical application of the first embodiment.

FIG. 7 is a cross-sectional view illustrating still another example of a module according to the example of practical application of the first embodiment. In FIG. 7, a module 300A has a configuration in which the passive device substrate 1 is embedded in a buildup substrate. Specifically, the passive device substrate 1 is embedded in a recess 310x formed in a core substrate 310 that is formed by laminating an insulating layer 320 on an insulating layer 330. The passive device substrate 1 may be fixedly attached to the bottom surface of the recess 310x by use of an adhesive layer (not shown) or the like placed therebetween.

An insulating layer 340 is formed continuously over the passive device substrate 1 and the insulating layer 320 of the core substrate 310. The insulating layer 340 has an interconnection layer 350 formed thereon that is patterned into a predetermined plan shape. A portion of the interconnection layer 350 is electrically coupled to the pad 32 of the passive device substrate 1 through a via interconnection 380.

An insulating layer 355 is formed on the upper surface of the insulating layer 340 to cover the interconnection layer 350. The insulating layer 355 has an opening 355x from which a portion of the interconnection layer 350 is selectively exposed. The opening 355x may expose the portion of the interconnection layer 350 that is coupled to the pad of the passive device substrate 1, for example. The portion of the interconnection layer 350 exposed through the opening 355x has the semiconductor chip 220 flip-chip mounted thereon with the bump 260 placed therebetween. The underfill resin 280 may fill the gap between the insulating layer 340 and the semiconductor chip 220. Provision may be made such that two or more insulating layers and interconnection layers are formed on the insulating layer 340.

The lower surface of the insulating layer 330 of the core substrate 310 has an interconnection layer 360 formed thereon that is patterned into a predetermined plan shape. The interconnection layer 350 and the interconnection layer 360 are electrically coupled to each other through a through-hole interconnection 390 that extends through the insulating layer 340 and the core substrate 310 (i.e., the insulating layers 320 and 330). An insulating layer 370 is formed on the lower surface of the insulating layer 330 to cover the interconnection layer 360. The insulating layer 370 has an opening 370x that selectively exposes a portion of the interconnection layer 360. The portion of the interconnection layer 360 exposed through the opening 370x serves as a pad that is to be coupled to another wiring substrate or the like. Provision may be made such that two or more insulating layers and interconnection layers are formed on the lower surface of the insulating layer 370.

The material of the insulating layers 320, 330, 340, 355 and 370 may be insulating resin such as epoxy-type resin. The insulating layer 320, 330, 340, 355 and 370 may have a reinforcement member such as glass cloth embedded therein. The material of the interconnection layers 350 and 360, the via interconnection 380, and the through-hole interconnection 390 may be copper or the like.

The module 300A has a configuration in which the passive devices 20 of the passive device substrate 1 are situated close to the interconnection layer 350 and the semiconductor chip 220. In this configuration, however, the insulating layer 40 and the magnetic layer 50 are in existence between the passive devices 20 and each of the interconnection layer 350 and the semiconductor chip 220. Because of this, the circuit characteristics of the passive devices 20 are not affected by the interconnection layer 350 or the semiconductor chip 220. Namely, the structure such as that of the module 300A in which the passive device substrate 1 is embedded in the core substrate 310 also ensures that the inductance values and the like of the passive devices 20 stays the same as intended design values.

Figure 8:
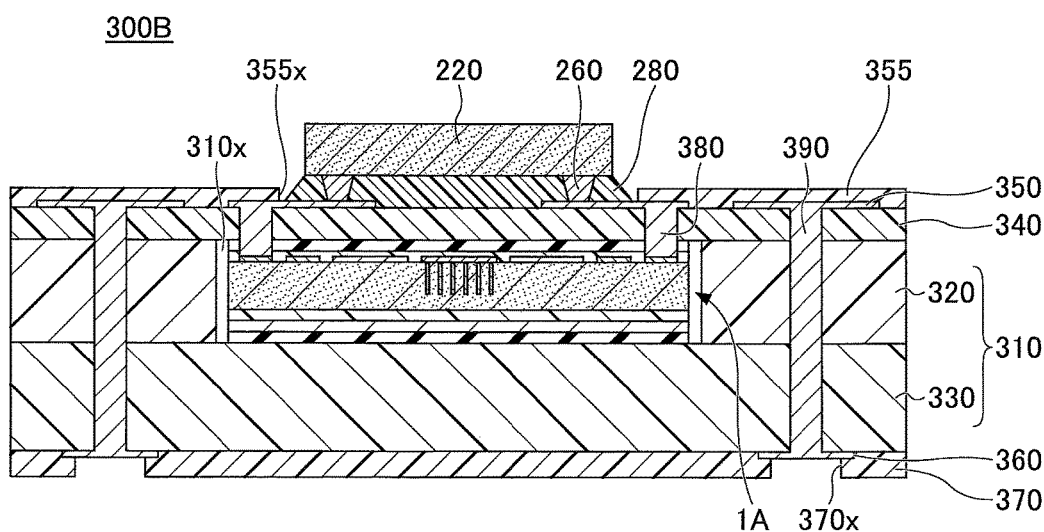
FIG. 8 is a cross-sectional view illustrating another example of the module according to the example of practical application of the first embodiment.

FIG. 8 is a cross-sectional view illustrating another example of a module according to the example of practical application of the first embodiment. A module 300B illustrated in FIG. 8 has a structure in which the passive device substrate 1A is embedded in the core substrate 310. Such a structure also provides the same or similar advantages as described heretofore. Further, a structure having the passive device substrate 1B embedded in the core substrate 310 also provides the same or similar advantages as described heretofore.

Further, the present invention is not limited to these embodiments, but various variations and modifications may be made without departing from the scope of the present invention.

The mounting structures described in connection with the examples of practical application are examples only, and other mounting structures also provide the same or similar advantages.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A passive device substrate, comprising:
a substrate;
a passive device disposed at a first surface of the substrate;
an insulating layer disposed on the first surface of the substrate to cover the passive device;
a magnetic layer disposed on an opposite side of the insulating layer from the substrate to overlap the passive device in a plan view taken in a thickness direction of the substrate; and
a metal layer disposed on a second surface, opposite the first surface, of the substrate, the metal layer being a nonmagnetic metal layer overlapping an entirety of the passive device in the plan view,
wherein the passive device has a portion thereof buried in the first surface of the substrate, and the metal layer has dot-shaped openings formed therethrough.

2. The passive device substrate as claimed in claim 1, further comprising another magnetic layer disposed on an opposite side of the metal layer from the substrate to overlap the passive device in the plan view.

3. The passive device substrate as claimed in claim 1, wherein the metal layer is electrically coupled to a ground.

4. The passive device substrate as claimed in claim 1, wherein the insulating layer has a flat surface opposite from the substrate, and the magnetic layer is formed on the flat surface.

5. The passive device substrate as claimed in claim 1, wherein the passive device includes an inductor comprising a spiral-shape wire disposed at the first surface of the substrate.

6. The passive device substrate as claimed in claim 1, wherein the nonmagnetic metal layer is made of copper, aluminum, or silver.

7. The passive device substrate as claimed in claim 1, further comprising an insulating layer disposed between the substrate and the nonmagnetic metal layer.

8. The passive device substrate as claimed in claim 1, further comprising an interconnection layer disposed on the first surface of the substrate, the interconnection layer including an interconnection pattern and a pad, the pad being exposed through an opening that is formed through the insulating layer and the magnetic layer.

* * * * *